US008375342B1

(12) United States Patent
Nequist et al.

(10) Patent No.: US 8,375,342 B1
(45) Date of Patent: Feb. 12, 2013

(54) METHOD AND MECHANISM FOR IMPLEMENTING EXTRACTION FOR AN INTEGRATED CIRCUIT DESIGN

(75) Inventors: Eric Nequist, Monte Sereno, CA (US); Richard Brashears, San Jose, CA (US); Matthew A. Liberty, Lake Oswego, CA (US); Michael C. McSherry, Portland, OR (US)

(73) Assignee: Cadence Design Systems, Inc., San Jose, CA (US)

( * ) Notice: Subject to any disclaimer, the term of this patent is extended or adjusted under 35 U.S.C. 154(b) by 81 days.

(21) Appl. No.: 12/987,064

(22) Filed: Jan. 7, 2011

Related U.S. Application Data

(62) Division of application No. 11/741,699, filed on Apr. 27, 2007, now Pat. No. 7,870,517.

(60) Provisional application No. 60/795,795, filed on Apr. 28, 2006.

(51) Int. Cl.
*G06F 17/50* (2006.01)

(52) U.S. Cl. ........ 716/111; 716/107; 716/132; 716/136; 716/139; 703/16

(58) Field of Classification Search .......... 716/111, 716/107, 132, 136, 139; 703/16
See application file for complete search history.

(56) References Cited

U.S. PATENT DOCUMENTS

| | | | |
|---|---|---|---|
| 5,369,594 A | 11/1994 | Huang | |
| 5,537,580 A * | 7/1996 | Giomi et al. | 716/55 |
| 5,596,506 A | 1/1997 | Petschauer | |
| 5,784,292 A | 7/1998 | Kumar | |
| 6,209,075 B1 | 3/2001 | Lau | |
| 6,219,823 B1 | 4/2001 | Hama | |
| 6,223,330 B1 | 4/2001 | Risler | |
| 6,230,299 B1 | 5/2001 | McSherry | |
| 6,249,903 B1 | 6/2001 | McSherry | |
| 6,298,473 B1 * | 10/2001 | Ono et al. | 716/53 |
| 6,578,175 B1 | 6/2003 | Benevit | |
| 6,594,805 B1 | 7/2003 | Tetelbaum | |
| 6,687,397 B2 | 2/2004 | DeYong | |
| 6,792,582 B1 | 9/2004 | Cohn | |
| 6,968,527 B2 | 11/2005 | Pierrat | |
| 6,981,235 B1 | 12/2005 | Salowe | |
| 6,983,440 B1 | 1/2006 | Nequist | |
| 6,996,790 B2 | 2/2006 | Chang | |
| 7,096,452 B2 | 8/2006 | Alvarez-Gomariz | |
| 7,100,128 B1 | 8/2006 | Nequist | |
| 7,100,129 B1 | 8/2006 | Salowe | |
| 7,181,383 B1 | 2/2007 | McGaughy | |
| 7,281,224 B2 | 10/2007 | Zhu | |
| 7,296,248 B2 | 11/2007 | Perez | |
| 7,313,769 B1 | 12/2007 | Lukanc | |
| 7,457,736 B2 | 11/2008 | Chang | |

(Continued)

OTHER PUBLICATIONS

Non-Final Office Action for U.S. Appl. No. 12/987,067 mailed on May 4, 2012.

(Continued)

*Primary Examiner* — Phallaka Kik
(74) *Attorney, Agent, or Firm* — Vista IP Law Group, LLP

(57) ABSTRACT

An improved method and system for performing extraction on an integrated circuit design is disclosed. Extraction may be performed at granularities much smaller than the entire IC design, in which a halo is used to identify a geometric volume surrounding an object of interest to identify neighboring objects and generate an electrical model. The extraction approach can be taken for Islands, Nets, as well as other granularities within the design. Re-extraction of a design can occur at granularities smaller than a net. Some approaches utilize Island-stitching to replace an island within a net. An approach is also described for improving cross-references for cross-coupled objects.

24 Claims, 18 Drawing Sheets

U.S. PATENT DOCUMENTS

| | | |
|---|---|---|
| 7,461,359 B1 | 12/2008 | Nequist |
| 7,475,217 B2 | 1/2009 | Abe |
| 7,590,955 B1 | 9/2009 | Nequist |
| 7,614,028 B1 | 11/2009 | Nequist |
| 7,657,860 B1 | 2/2010 | Brashears |
| 7,665,045 B1 | 2/2010 | Nequist |
| 7,698,666 B2 | 4/2010 | Nequist |
| 7,721,235 B1 | 5/2010 | Nequist |
| 7,725,845 B1 | 5/2010 | White |
| 7,752,595 B2 * | 7/2010 | Maeda et al. ............ 716/52 |
| 7,962,876 B2 | 6/2011 | Oh |
| 8,156,453 B1 | 4/2012 | Nozarian |
| 2001/0010090 A1 | 7/2001 | Boyle et al. |
| 2002/0170020 A1 | 11/2002 | Darden |
| 2003/0182644 A1 | 9/2003 | Li |
| 2003/0208741 A1 * | 11/2003 | Ono ............................ 716/21 |
| 2004/0073878 A1 * | 4/2004 | Hasegawa et al. ............ 716/8 |
| 2004/0128636 A1 | 7/2004 | Ishikura |
| 2004/0153979 A1 | 8/2004 | Chang |
| 2005/0050496 A1 | 3/2005 | Kovacs et al. |
| 2005/0114812 A1 | 5/2005 | Kok |
| 2005/0155008 A1 | 7/2005 | Archambeault |
| 2005/0160388 A1 | 7/2005 | Cobb |
| 2005/0172251 A1 * | 8/2005 | Chang et al. ................ 716/6 |
| 2005/0246675 A1 | 11/2005 | Scheffer |
| 2006/0026551 A1 | 2/2006 | Shrowty |
| 2006/0036982 A1 * | 2/2006 | Hoff et al. .................... 716/5 |
| 2006/0136855 A1 * | 6/2006 | Hoff et al. .................. 716/11 |
| 2006/0141369 A1 * | 6/2006 | Ito et al. ...................... 430/5 |
| 2006/0212869 A1 | 9/2006 | Bril |
| 2006/0234140 A1 | 10/2006 | Alvarez-Gomariz |
| 2006/0288315 A1 | 12/2006 | Perez |
| 2007/0198967 A1 | 8/2007 | Ren |
| 2008/0022237 A1 | 1/2008 | Adler |
| 2008/0028357 A1 | 1/2008 | Shimony |
| 2008/0066042 A1 | 3/2008 | Archambeault |
| 2008/0104555 A1 | 5/2008 | DeMaris |
| 2008/0163134 A1 | 7/2008 | Nequist |
| 2008/0163150 A1 | 7/2008 | White |
| 2008/0216028 A1 | 9/2008 | Su |
| 2009/0089720 A1 | 4/2009 | Nequist |
| 2009/0172623 A1 | 7/2009 | Cross |
| 2009/0172625 A1 | 7/2009 | Nequist |
| 2009/0172626 A1 | 7/2009 | Pucci |
| 2009/0199139 A1 | 8/2009 | White |
| 2009/0288048 A1 | 11/2009 | Moroz |
| 2010/0005434 A1 | 1/2010 | Wang |
| 2010/0042958 A1 | 2/2010 | Moroz |

OTHER PUBLICATIONS

Non-Final Office Action for U.S. Appl. No. 12/987,072 mailed on Apr. 4, 2012.

Non-Final Office Action for U.S. Appl. No. 12/824,065 mailed on Apr. 4, 2012.

Notice of Allowance dated Jul. 13, 2012 for U.S. Appl. No. 12/987,072.

Non-Final Office Action for U.S. Appl. No. 12/987,067 mailed on Dec. 5, 2012.

* cited by examiner

METHOD AND MECHANISM FOR IMPLEMENTING EXTRACTION FOR AN INTEGRATED CIRCUIT DESIGN

CROSS-REFERENCE TO RELATED APPLICATIONS

The instant application constitutes a division of U.S. application Ser. No. 11/741,699, now U.S. Pat. No. 7,870,517, entitled "METHOD AND MECHANISM FOR IMPLEMENTING EXTRACTION FOR AN INTEGRATED CIRCUIT DESIGN", and filed on Apr. 27, 2007, that claims the benefit of U.S. Provisional Application Ser. No. 60/795,795, filed on Aril 28, 2006. The entire contents of both applications are hereby expressly incorporated by reference in their entirety.

The instant application constitutes cross-related to U.S. application Ser. No. 12/987,067, filed concurrently with the instant application, titled "METHOD AND MECHANISM FOR IMPLEMENTING EXTRACTION FOR AN INTEGRATED CIRCUIT DESIGN", and U.S. application Ser. No. 12/987,072, filed concurrently with the instant application, titled "METHOD AND MECHANISM FOR IMPLEMENTING EXTRACTION FOR AN INTEGRATED CIRCUIT DESIGN". The instant application is further cross-related to U.S. application Ser. No. 11/229,320, now U.S. Pat. No. 7,665,045, filed on Sep. 15, 2005 and entitled "METHOD AND MECHANISM FOR IDENTIFYING AND TRACKING SHAPE CONNECTIVITY". The entire contents of the aforementioned applications are hereby expressly incorporated by reference in their entireties.

FIELD OF THE INVENTION

The present invention relates generally to electronic circuit design, manufacturing, and verification.

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes.

After an integrated circuit designer has created an initial integrated circuit layout, the integrated circuit designer then tests and optimizes the integrated circuit layout using a set of EDA testing and analysis tools. Common testing and optimization steps include extraction, verification, and compaction. The steps of extraction and verification are performed to ensure that the integrated circuit layout will perform as desired. The test of extraction is the process of analyzing the geometric layout and material composition of an integrated circuit layout in order to "extract" the electrical characteristics of the designed integrated circuit layout. The step of verification uses the extracted electrical characteristics to analyze the circuit design using circuit analysis tools.

Common electrical characteristics that are extracted from an integrated circuit layout include capacitance and resistance of the various "nets" (electrical interconnects) in the integrated circuit. These electrical characteristics are sometimes referred to as "parasitic" since these are electrical characteristics are not intended by the designer but result from the underlying physics of the integrated circuit design. For example, when an integrated circuit designer wishes to connect two different locations of an integrated circuit with an electrical conductor, the electrical circuit designer would ideally like perfect conductor with zero resistance and zero capacitance. However, the geometry of a real conductor, its material composition, and its interaction with other nearby circuit elements will create some parasitic resistance and parasitic capacitance. The parasitic resistance and parasitic capacitance affect the operation of the designed integrated circuit. Thus, the effect of the parasitic resistance and parasitic capacitance on the electrical interconnect must be considered.

To test an integrated circuit layout, the integrated circuit designer 'extracts' parasitic resistance and parasitic capacitance from the integrated circuit layout using an extraction application program. Then, the integrated circuit designer analyzes and possibly simulates the integrated circuit using the extracted parasitic resistance and parasitic capacitance information. If the parasitic resistance or parasitic capacitance causes undesired operation of the integrated circuit, then the layout of the integrated circuit must be changed to correct the undesired operation. Furthermore, minimizing the amount of parasitic resistance and parasitic capacitance can optimize the performance of the integrated circuit by reducing power consumption or increasing the operating speed of the integrated circuit.

Conventional extraction tools operate in a "batch" mode, which considers the entirety of the IC design or substantially large areas of an IC design to perform extraction. One common approach when operating in a batch mode is to use the scan line technique to scan the entire design all at once.

This type of approach is typically optimized and is efficient when large areas of a design need to be processed. However, consider the situation when the IC design is modified such that only a small portion of the design has changed. With conventional extraction tools, the entirety of the design, or a substantially large portion of the design, may be re-processed to perform extraction, even substantial sections of the design that did not undergo any modification. This is the negative artifact of the scan line-type approach which works on an area-based approach. This could result in extreme inefficiencies when only small portions of the design need to undergo extraction and cause significant delays and resource wastage during the design and verification process.

SUMMARY

Some embodiments of the present invention provide an improved method and system for performing extraction on an integrated circuit design. In some embodiments, extraction can be performed at granularities much smaller than the entire IC design, in which a halo is used to identify a geometric volume surrounding an object of interest to identify neighboring objects and generate an electrical model. The extraction approach can be taken for Islands, Nets, as well as other granularities within the design. Re-extraction of a design can occur at granularities smaller than a net. Some embodiments utilize Island-stitching to replace an Island within a net. An approach is also described for improving cross-references for cross-coupled objects. Other and additional objects, features, and advantages of the invention are described in the detailed description, figures, and claims.

BRIEF DESCRIPTION OF THE DRAWINGS

The drawings illustrate the design and utility of embodiments of the present invention, in which similar elements are referred to by common reference numerals. In order to better appreciate the advantages and objects of a preferred embodiment, reference should be made to the accompanying drawings that illustrate this preferred embodiment. However, the drawings depict only one embodiment of the invention, and should not be taken as limiting its scope.

DETAILED DESCRIPTION

Some embodiments of the present invention provide an improved method and system for performing extraction on an integrated circuit design.

Net Tube Extraction

As noted above, conventional EDA extractor tools utilize a batch mode to process all or a substantial portion of the IC design all at once for the design. The significant drawback with this approach is that even if the designer makes only a small change to the design, then the batch process may re-extract the entire design or a substantial portion of the design.

The present invention provides an improved approach for performing extraction at smaller granularities within the IC design. In general, the present invention determines the specific objects that that need to be extracted as well as the surrounding neighborhood around those objects that need to be identified to perform extraction. The process performs a geometric gathering of data that can then be used to create an electrical model of that neighbor of objects. By handling extraction in this manner, the granularity of extraction can be processed at levels that are much smaller and more precise than previous approaches.

Figure 1:
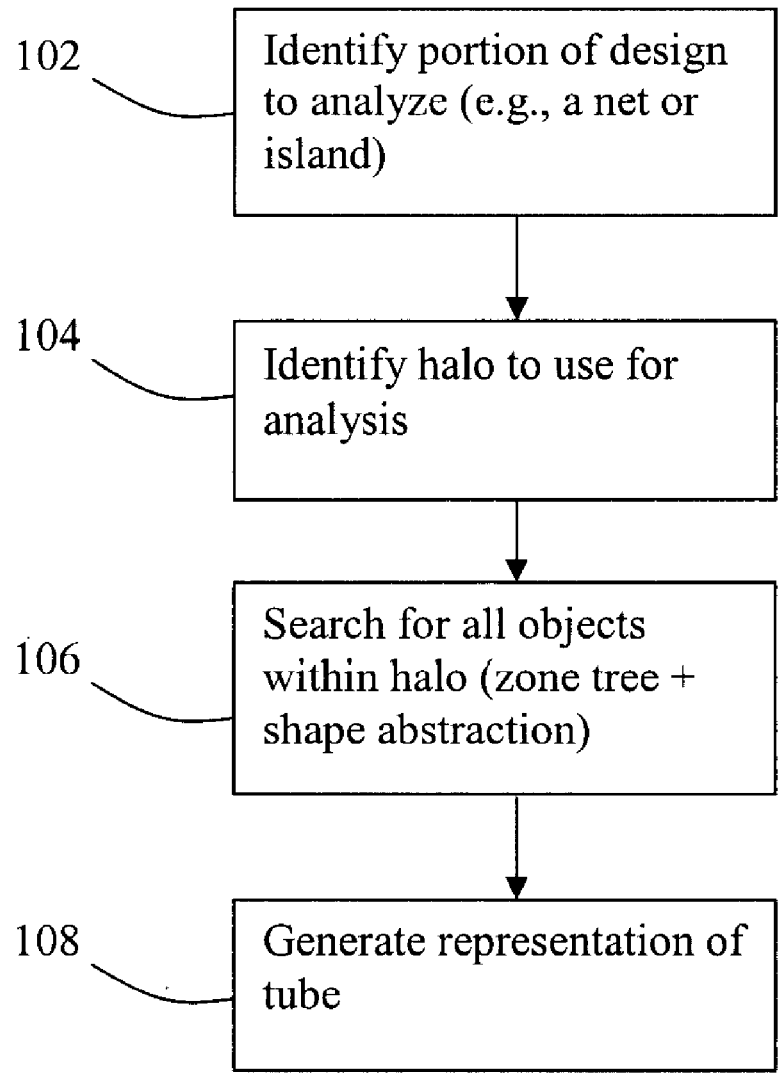
FIG. 1 shows a flowchart of a process for using a net tube for extraction according to some embodiments of the invention.

FIG. 1 shows a flowchart of an embodiment of the invention for performing extraction. At 102, the process begins by identifying a portion of the design to analyze. Unlike the conventional approaches, the present process can perform the extraction analysis on a net-by-net basis, or even smaller granularities within the net. For example, assume that a designer makes a change to only a single net within the design. The present approach can identify only that net as the subject of the new extraction analysis.

As described in more detail below, the present process can also identify portions of the design to analyze that are smaller than an individual net. As just one example, a "net-Island" or "Island", comprising only the contiguous portion of a net that resides on a single layer, can be the identified subject of the present extraction process.

The process takes the net of interest, and chases all the segments and pieces that form the net. One approach for chasing all the segments of a net is described in co-pending U.S. application Ser. No. 11/229,320 filed on Sep. 15, 2005, now U.S. Pat. No. 7,665,045, which is hereby incorporated by reference in its entirety.

A "halo" distance is identified for the portion of the IC design that is being analyzed (104). In one embodiment, the halo distance is intended to correspond to the point or distance at which the measured value is different from the isolation value for capacitance. Different types or locations of objects being analyzed may correspond to different halo distances. Some example factors that could be used to determine halo distance include the purpose and configuration of the wiring structures being analyzed. Even within the same net, different portions of the net may correspond to different halo sizes and shapes.

At 106, a search is performed for all objects within the halo. Any suitable approach can be used to perform this search function. Examples of searching approaches that can be used to implement some embodiments of the invention are disclosed in U.S. Pat. Nos. 6,981,235 and 7,100,128, both of which are hereby incorporated by reference in their entirety.

In one embodiment, the search is performed for each layer encompassed by the halo. The search begins at the same layer at which the object being analyzed resides. The search then moves through each adjacent layer until all layers within the halo distance has been searched.

At 108, an electrical representation of the net tube is generated. In one embodiment, the electrical model of geometric shapes within the net tube is determined by having the extractor traverse all shapes within the geometry. Redundant and overlapping shapes are removed or accounted for in the net tube, e.g., by performing a geometric OR operation. The process will utilize a consistent view of the wires and have a consistent point(s) of reference for the analysis. Any suitable algorithms, system, or tool can be employed to generate an electrical model of the net tube.

In this manner, only specific nets, or portions of nets, need to be analyzed after a change is made to the IC design. This significantly improves the efficiency of the extraction operation if only small portions of the IC design need to be extracted.

In some embodiments, the present invention can therefore be used in conjunction with traditional batch mode extractors. In these alternate embodiments, the batch mode extractors are used if significantly large portions of the design need to be extracted. However, if only smaller portions of the design need to be extracted, then the present approach, e.g., net-by-net or Island-by-Island, is utilized. Heuristics may be employed to determine which approach is more suitable.

Figure 2:
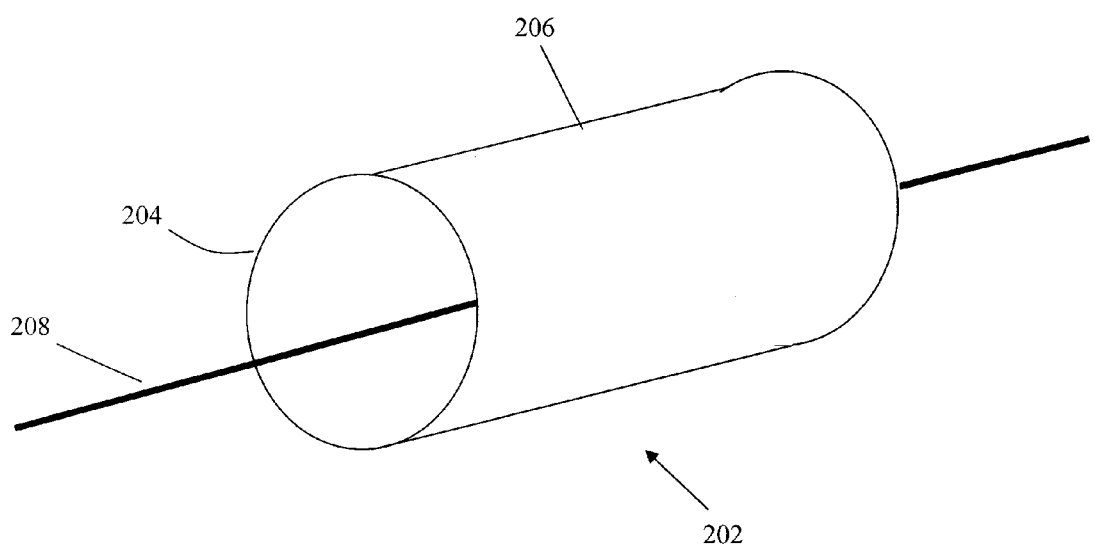
FIGS. 2-4 illustrate example halo shapes according to some embodiments of the invention.

As noted above, the size and dimensions of the halo can be configured based upon any desired performance or analysis factors. FIG. 2 illustrates an example halo 202 having a round cross-section 204, which forms a cylindrical shape 206 when extended along the object 208 being analyzed. This type of net tube can be formed by creating a fixed radius from the location of the object 208. When performing the actions of 106 from FIG. 1, the volume within cylindrical shape 206 is searched for the presence of any geometric objects.

Figure 3:
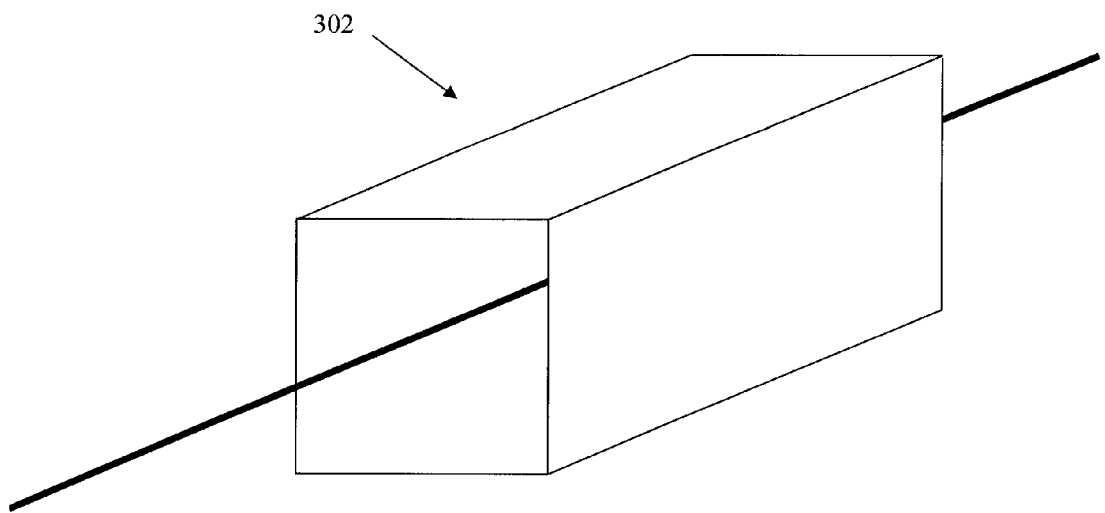
Figure 4:
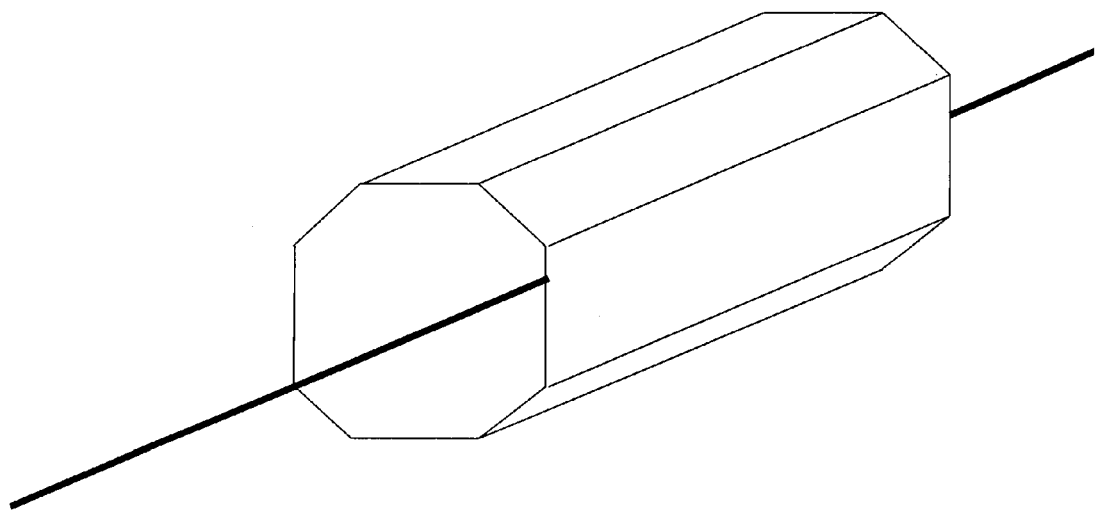

To facilitate the calculations of action 106, the dimensions of the halo can be configured to have a constant width along a given layer of the design. Referring to FIG. 3, shown is a rectangular halo shape 302. In this approach, the dimensions of the net tube are constant, regardless of which layer of the design is being analyzed. FIG. 4 shows yet another example of a halo 402, in which an octagonal halo shape is employed.

Figure 5:
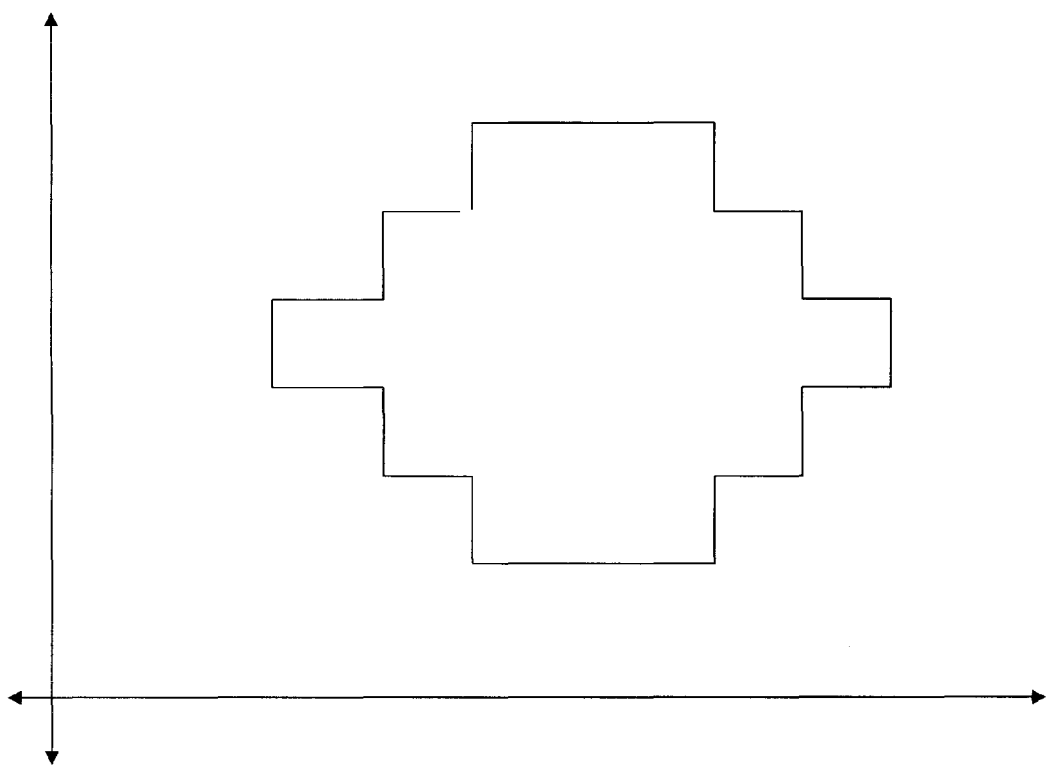
FIGS. 5-6 illustrate cross-sections of halos having different sizes on different layers according to some embodiments of the invention.
Figure 6:
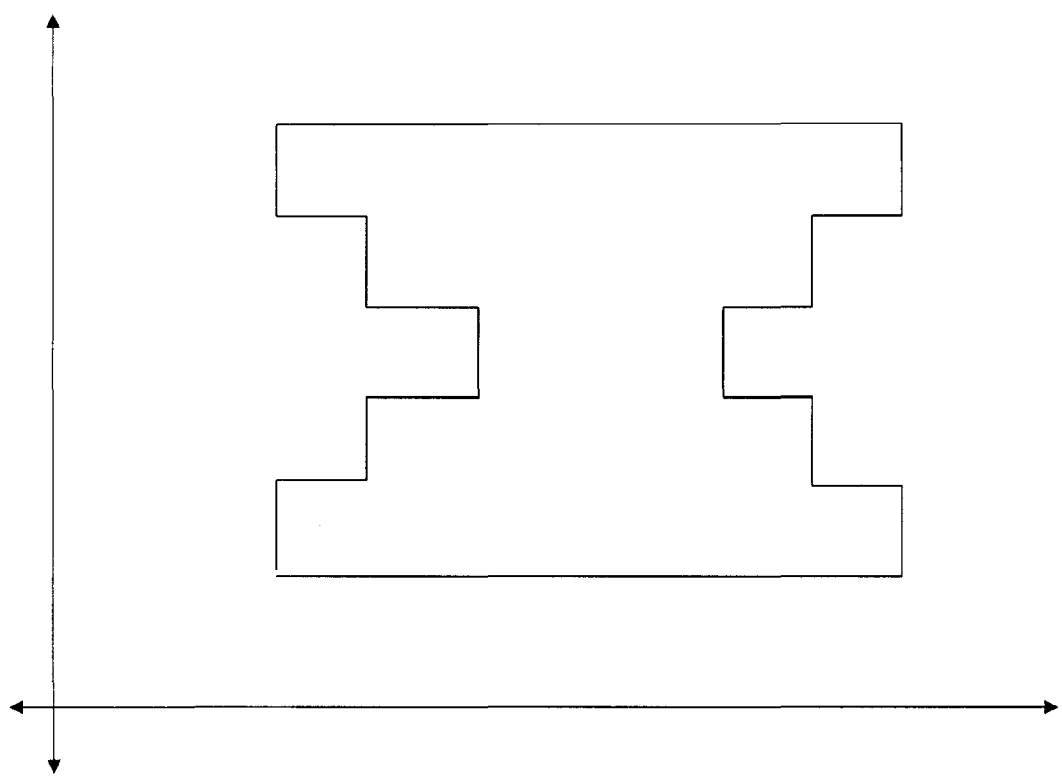

Different layers can have different halo widths. To illustrate, consider the cross-section of a halo of FIG. 5. In this figure, the halo has a small distance on the layers farther away from the object being analyzed. FIG. 6 shows the opposite, in which the halo becomes wider as it moves farther away.

Figure 7:
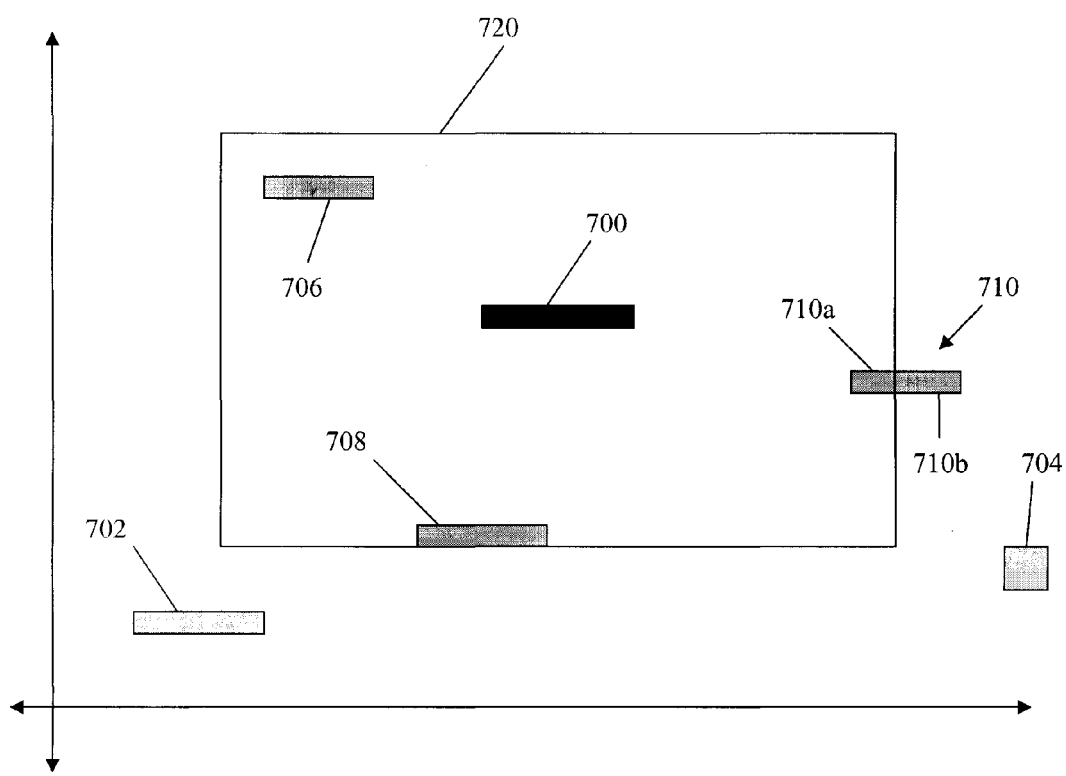
FIG. 7 shows an example of searching for objects within a halo.

FIG. 7 illustrates the process of searching for objects within a halo. In this example, the object under analysis is wire object 700. The halo 720 that has been formed around wire object 700 has a rectangular cross-sectional shape. When a search function is performed, it can be seen that objects 702 and 704 do not fall within the boundaries of halo 720. Therefore, these objects are not considered when forming the electrical model for extraction analysis. However, objects 706 and 708 do fall within the boundaries of halo 720. Therefore, these objects are considered when constructing an electrical model.

It is noted that object 710 has a portion 710*a* that falls within halo 700 and a portion 710*b* that falls outside of the halo 720. Any suitable approach can be taken to analyze this situation. In one embodiment, if any portion of the object falls within the halo, then that object is considered when forming the electrical model. Alternatively, heuristics is employed to determine whether a sufficient enough portion of the object is within the halo such that it should be considered. Some options for handling this situation include:

Cut off the portion of the object that extends beyond the halo include all of the object, even portions that extend beyond the halo exclude all of the object, even portions that exist within the halo include variably specific portions of the object within or beyond the halo Island Analysis At this point, it is helpful to describe handling and processing of Islands according to some embodiments of the invention. An Island is a contiguous portion of a net that exists on a single layer of the IC design. The Island may connect to other Islands through one or more vias. A net may be formed by multiple Islands that are connected through multiple vias.

Therefore, as soon as an Island makes a layer transition, then it no longer forms part of the present Island under examination. An Island has a concept of end points. Either a terminal or a via would be considered an end point for an Island.

Figure 8A:
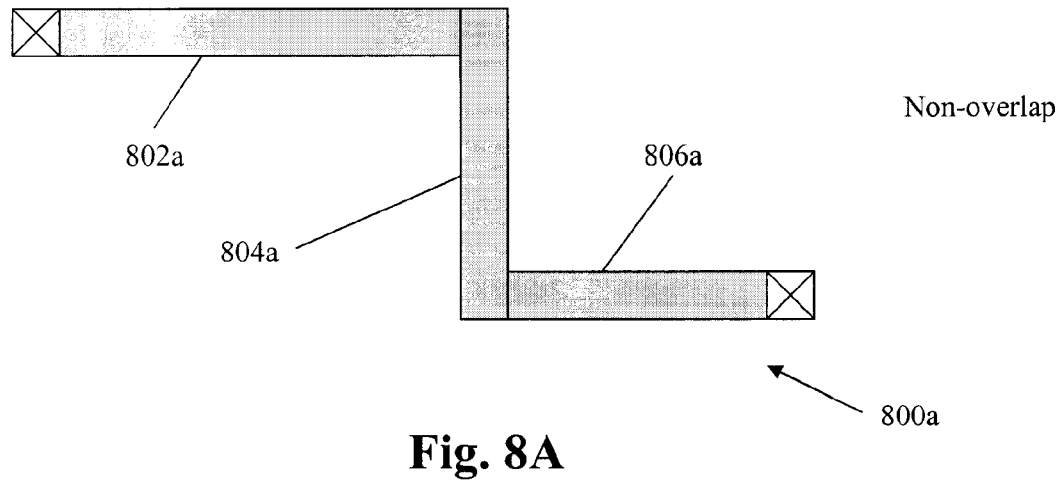
FIGS. 8A-B illustrate overlapping and non-overlapping Islands.
Figure 8B:
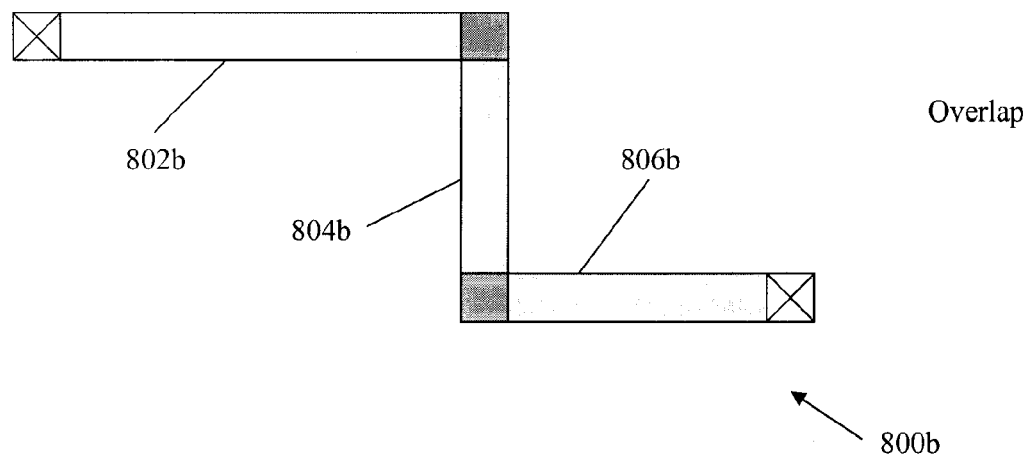

When analyzing the objects that form a net, the specific configuration of objects that form the net may influence the electrical model of the net. To explain, consider the two Island configurations shown in FIGS. 8A and 8B. In the example of FIG. 8A, it is noted that the objects 802*a*, 804*a*, and 806*a* forming the Island 800*a* do not overlap, but instead exactly abut each other as shown. In contrast, in the example of FIG. 8B, object 802*b* overlaps 804*b* and object 804*b* also overlaps 806*b*.

When both of these designs are formed in semiconductor, the resulting object shapes will end up being the same. However, when considering the electrical analysis of these two configurations, these two configurations may produce different electrical analysis results due to the extra overlap of materials shown in FIG. 8B. In part, this could result from redundant consideration of the materials within the overlap areas.

In some embodiments, normalization is performed upon Island shapes to remove the overlap materials. This allows the geometric shapes to be represented and analyzed in a consistent way across the entire design.

Figure 9:
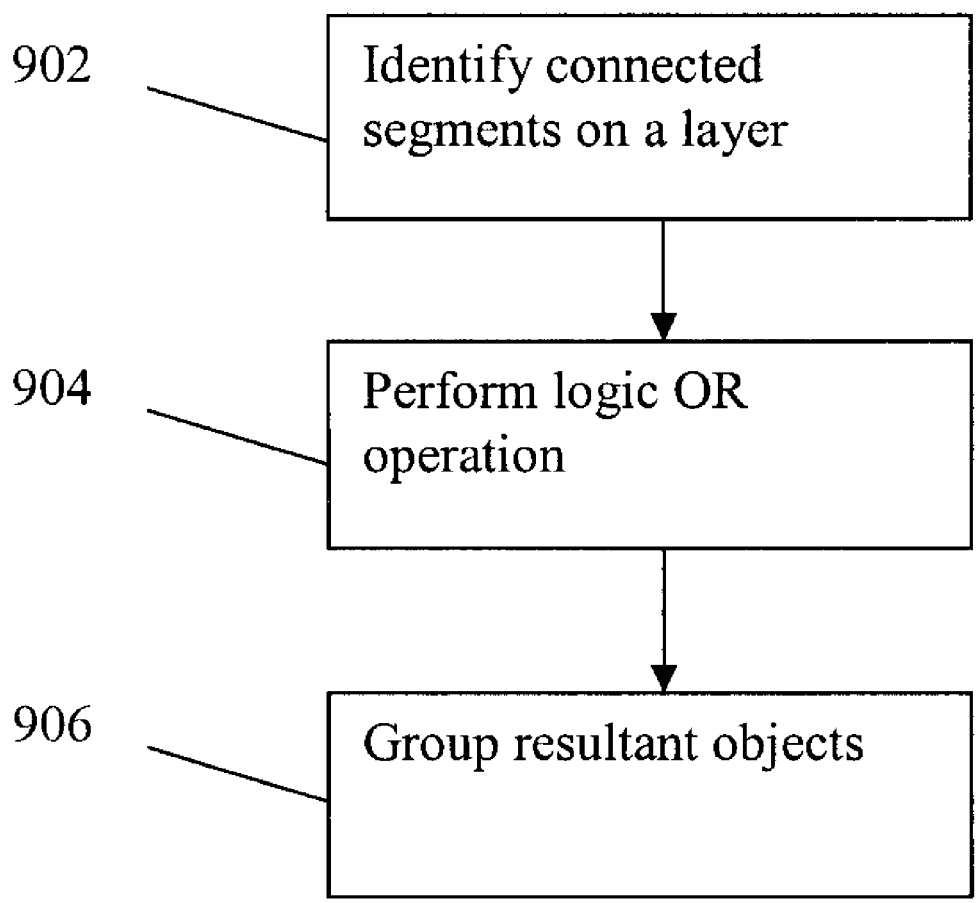
FIG. 9 shows a flowchart of a process for normalizing Islands according to some embodiments of the invention.

FIG. 9 shows a flowchart of a process for forming Islands according to some embodiments of the invention. At 902, the segments of the Island are identified by identifying all segments that are connected on a single layer of a design. At 904, a logical OR operation is performed upon the connected segments. This step removes overlapping portions and normalizes the segments forming the Island. At 906, the resulting segments are grouped together to from the Island.

Figure 10:
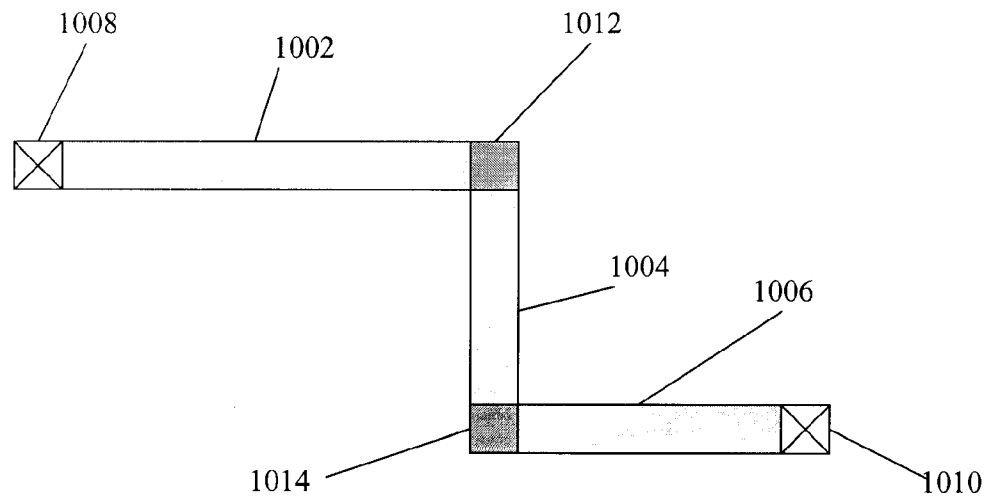
FIG. 10 provides an illustrative example for the process of FIG. 9.
Figure 10:
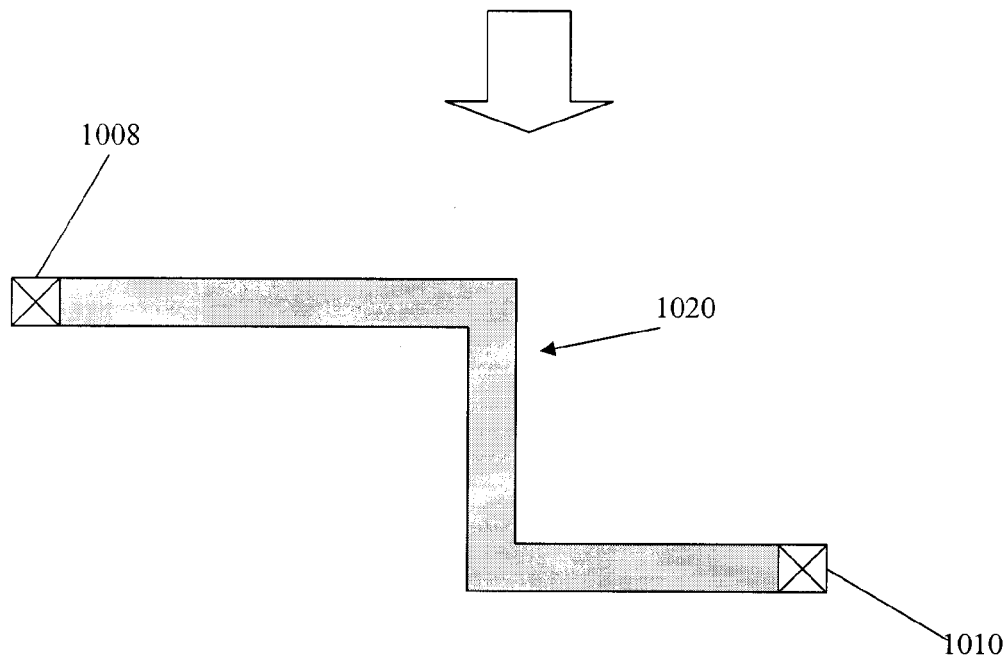

FIG. 10 provides an illustrated example of this process. The process begins by identifying all connected objects form a first end point to a second end point. Here, a first endpoint is the via 1008. Each connected shapes is chased until all connected shapes are found and the endpoint is reached. Here, endpoint via 1008 is connected to shape 1004. Shape 1002 is connected to shape 1004, which is connected to shape 1006, which is in turn connected to a via 1010. Via 1010 forms another endpoint. Therefore, it can be seen that objects 1002, 1004, and 1006 form the objects of an Island, since all of these objects are contiguous on a single layer.

A logical OR operation is performed upon objects 1002, 1004, and 1006 to remove any overlapping portions. It can be seen that these objects overlap at locations 1012 and 1014. Thereafter, the objects are grouped together to form an Island 1020.

Improved Incremental Extraction

Figure 11:
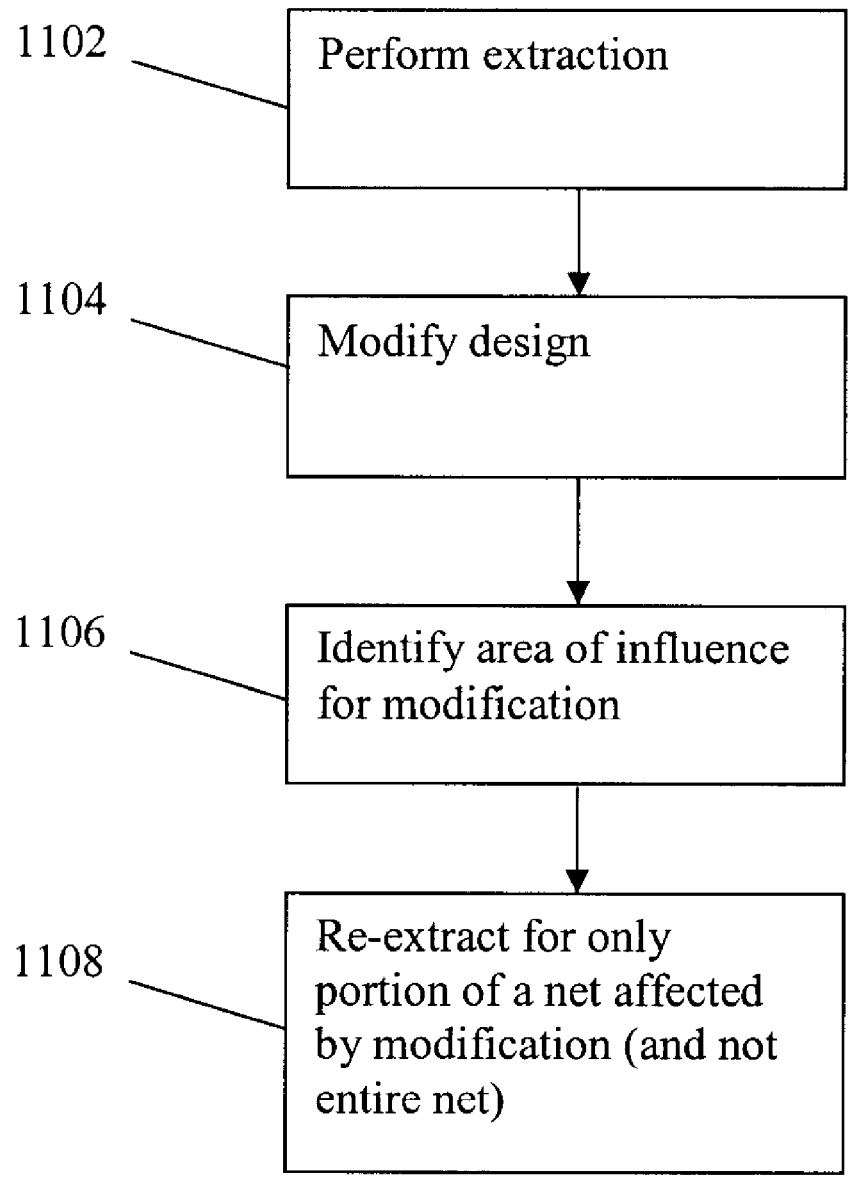
FIG. 11 shows a process for re-extraction according to some embodiments of the invention.

FIG. 11 shows a flowchart of a process for performing incremental extraction according to some embodiments of the invention. At 1002, extraction is performed over the entire IC or a substantial portion of interest for the design. As noted above, this action may be performed by using an approach that is efficient when analyzing large areas of a design, e.g., a batch mode or scan-line approach. Alternatively, this action may be taken using a smaller granularity approach, such as the net-by-net or Island-by-Island approach provide in the above examples.

Assume that a modification occurs to the IC design at 1104. At 1106, identification is made of the modified portion of the IC design that is of influence for that modification. As noted above, this action may be performed by forming a halo around the modified portions and identifying all objects within that halo volume.

At 1108, extraction is performed again only for the portions of the design or net that is affected by the modification. In this approach, the entire design is not re-extracted. In some embodiments, the entire net is not re-extracted. Instead, only the Islands within the net affected by the modification are re-extracted.

Figure 12:
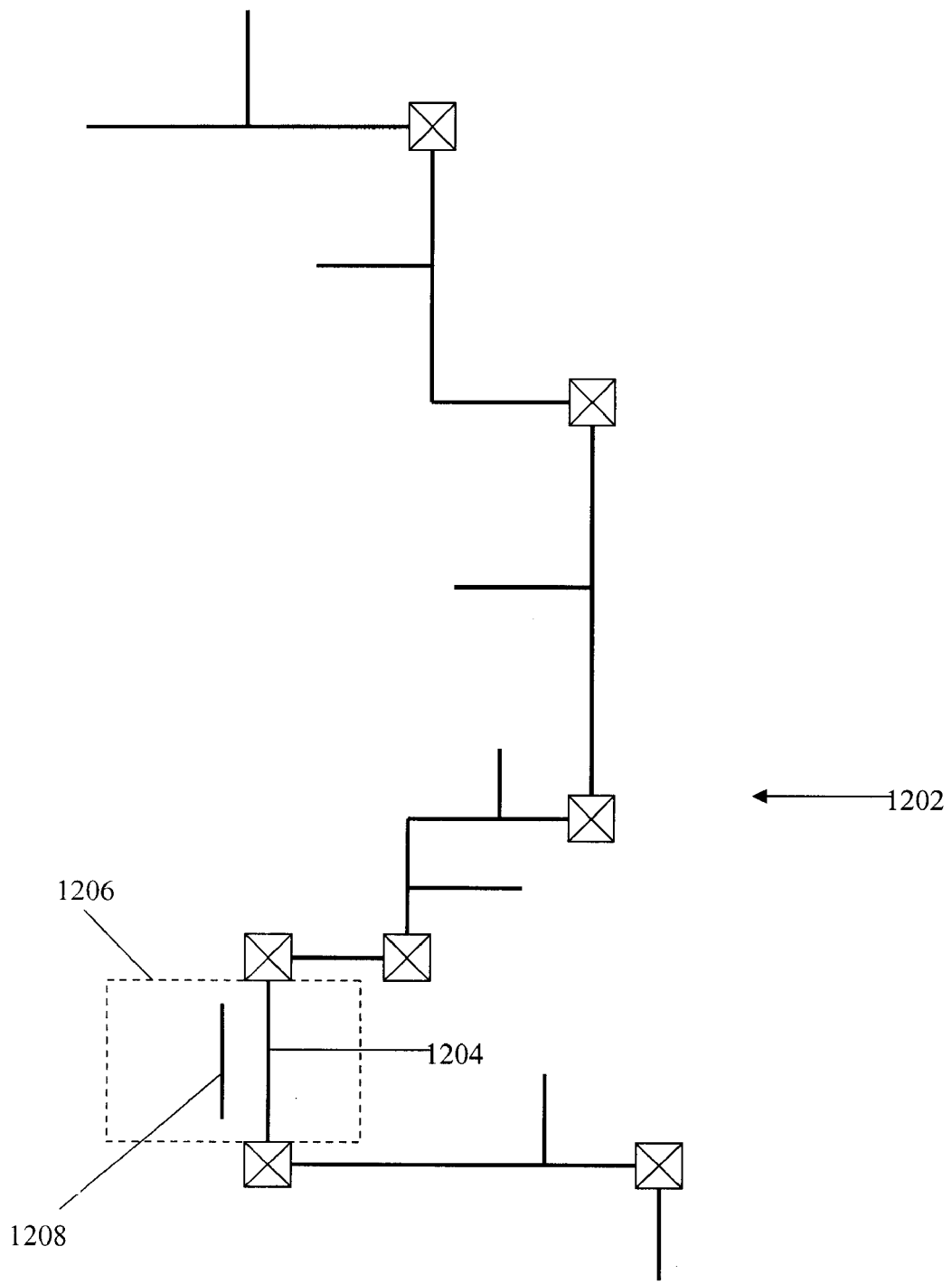
FIG. 12 provides an illustrative example for re-extraction according to some embodiments of the invention.

FIG. 12 provides an illustrative example of this process. In this example, a net 1202 is formed from many Islands on many different layers of the design. Assume that only Island 1204 was modified by the change to the IC design. At this point, conventional extractors would require the entire design, or a substantial portion of it, to be re-extracted. In the present embodiment, not even the entire net needs to be re-extracted. Instead, a determination is made of the specific portion of the net that needs to be re-extracted. Here, assume that only the portion 1206 within the dashed halo box needs to be considered. A search is performed and it can be seen that object 1208 is found within halo 1206. Therefore, only this portion needs to be re-extracted as a result of the modification.

Incremental Coupling

When an electrical analysis is performed for extraction, there are several ways in which coupling between nets can be represented. Two examples are the "coupled" and "decoupled" approaches. In the decoupled approach, there is no cross-coupling that that needs to be maintained between two nets. In the decoupled approach, regardless of how a given net is modified or analyzed, its neighboring nets do not need to be considered.

In the coupled case, there is a capacitance C between two nets and hence there is also a cross-reference that needs to be considered between the two nets. Therefore, if a modification or change occurs to a given net, its cross-reference to its neighboring net(s) should be adequately preserved.

Figure 13:
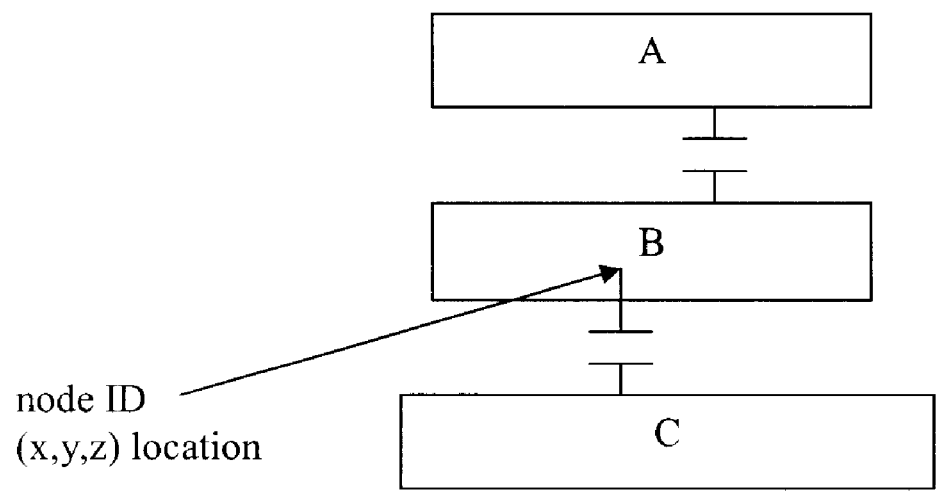
FIG. 13 shows an example of cross-coupled nets/Islands.

To illustrate some issues relating to the coupled case, consider the arrangement of nets shown in FIG. 13. Net A is cross-coupled to Net B, and hence there are cross-references between Nets A and B. Net B is cross-coupled to Net C, and hence there are cross-references between Nets B and C. Therefore may be additional cross-coupled nets extending beyond Net C, such as Nets D, E, F, G, etc. (not shown). It is noted that each of these Nets A, B, and C could also be Islands. For the purposes of explanation, the terms shall be used interchangeably in this section of the application.

Assume that a change is made to Net A. Because of the proximity between Nets A and B, the change to Net A may necessitate a corresponding change to Net B. However, in this case, because of the distance between Nets A and C, there is no need to make a change to Net C. The problem is that if Net B, Net C may have to change to maintain proper cross-references with Net B, which may necessitate further changes down the line to subsequent Nets D, E, F, and others. It is desirable to be able to maintain the cross-reference between Nets B and C, even if Net C is not modified.

Some embodiments of the present invention address this problem by having a first net provide to a second net a node in a particular and fixed geometric location. In this manner, regardless of the changes that occur to a given cross-coupled net, the cross-reference is maintained since the reference node is always maintained in a known geometric location. When the time comes to perform extraction, this allows the system to guarantee that there is a node at that location.

In some embodiments, this approach is implemented by utilizing a set of constraints on the extractor. This allows the nets to have nodes that are synchronized with what has previously been established for the nets. Multiple constraint levels can be established. For example, Level 0 could be established in which nodes can be freely modified or destroyed. This level generally refers to the net or Island which is undergoing modification. A Level 1 can be established in which one or more nodes are maintained for subsequent levels. This level generally refers to a net or Island which undergoes some change (e.g., because a neighboring net or Island has changed), but is cross-coupled to a net or Island which will not change. Another level, referred to as Level 2, can be established which refers to a net or Island which will not undergo any modification and for which no extraction is performed.

Figure 14:
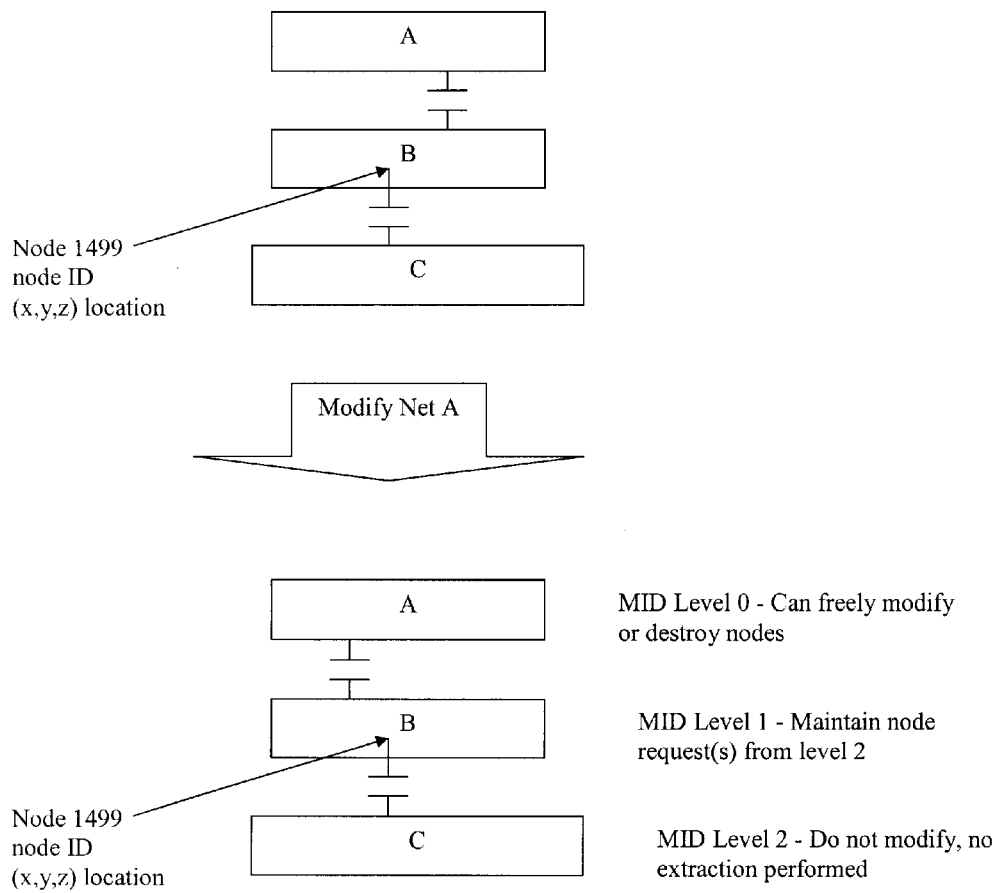
FIG. 14 provides an illustrative example of a process for handling cross-references according to some embodiments of the invention.

FIG. 14 shows an embodiment of this approach. Shown in this figure are cross-coupled Islands A, B, and C. Assume that a node 1402 has been placed at Island B to which Island C is cross-referenced. Further assume that Island A has been modified. Assume that the change to Island A will also cause a corresponding change to Island B. However, the change to Island A will not cause a change to Island C.

In this example, since Island A is being modified, it is classified as a Level 0 Island, which means that its nodes can be freely changed. Island B is cross-coupled to Island A, and the nodes between Island A and Island B will clearly also change. However, since Island C will not change, Island B will be classified as a level 1 Island, which means that any change to Island B will also require this Island to maintain its node 1402 that corresponds to Island C. The node 1402 will be maintained at a known (x,y,z) location regardless of the change that occurs to Island B. Since Island C will not change, it is classified as a level 2 Island.

Figure 15:
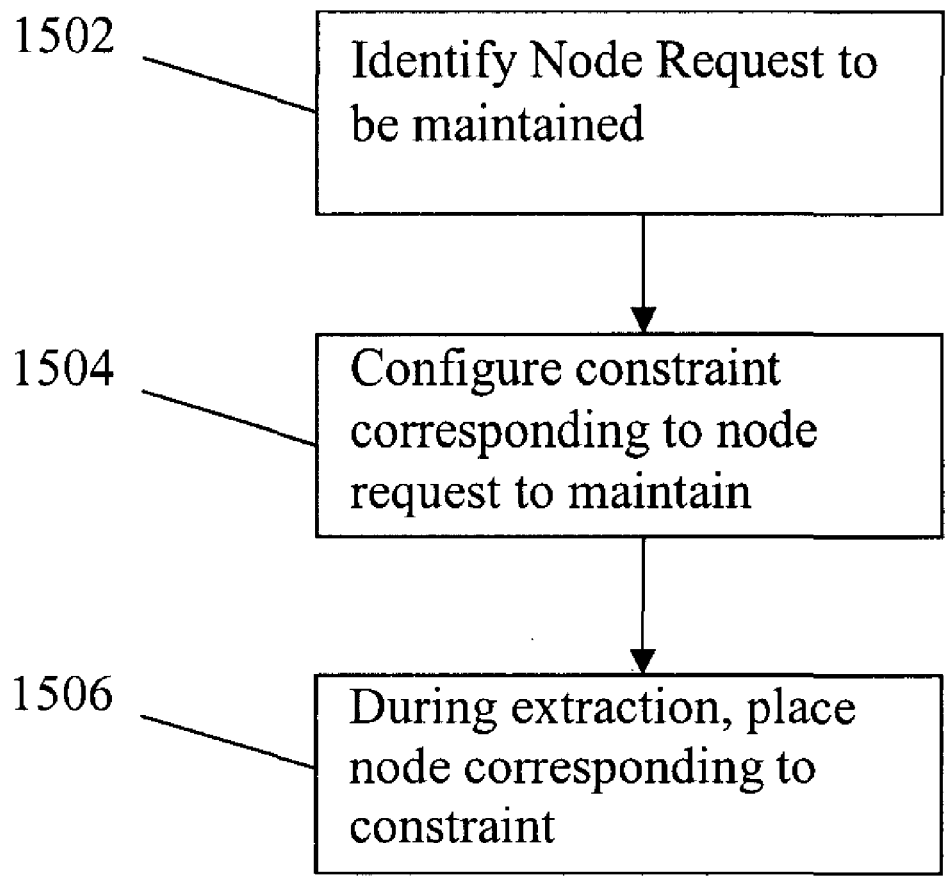
FIG. 15 shows a flowchart of a process for handling cross-references according to some embodiments of the invention.

FIG. 15 shows a flowchart of a method for implementing this invention, according to some embodiments. At 1502, identification is made of the Node Request to be maintained. In the example of FIG. 14, the Node Request relates to node 1402. At 1504, constraints are configured to correspond to the maintained of the appropriate node(s). For example, the objects being affected are categorized based upon whether the object is within Level 0, Level 1 or Level 2. During the modification and extraction process, the node(s) at the known location are suitably placed to correspond to the established constraints (1506).

Island-Stitching

For a given net, it is sometimes desirable to replace Islands with a different Island or a different configuration of that Island. Described herein is a novel approach for Island-stitching which can be performed in some embodiments of the invention.

Figure 16:
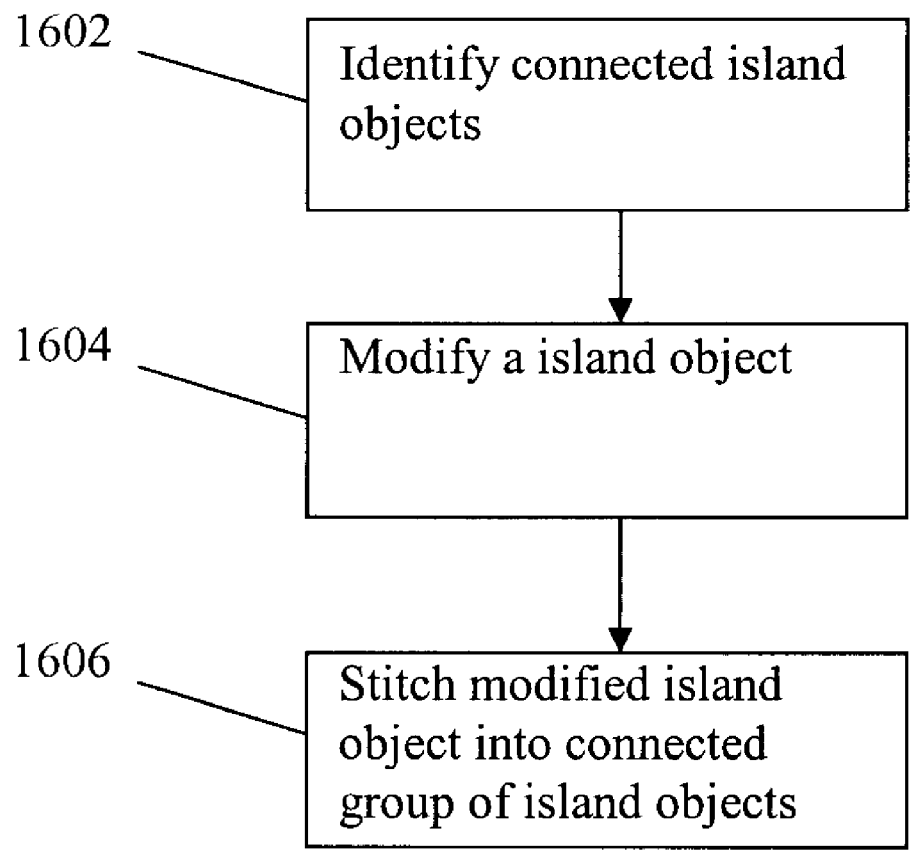
FIG. 16 shows a flowchart of a process for stitching Islands together according to some embodiments of the invention.

FIG. 16 shows a flowchart of a process for stitching Islands together according to an embodiment of the invention. At 1602, identification is made of connected ISLAND objects for which a modification is desired. At 1604, one or more of the ISLAND objects are modified.

At 1606, the modified Island object is stitched into the connected group of ISLAND objects. In the present embodiment, this is implemented by tracking the endpoints of the ISLAND that is being modified and stitched, so that the modification maintains the relative coordinates of the original Island. In addition, any ports or nodes that must be maintained are tracked and created in the modified Island. Once the necessary locations are tracked and maintained, the modified Island can be used to replace the original Island in the grouping of Islands.

Figure 17:
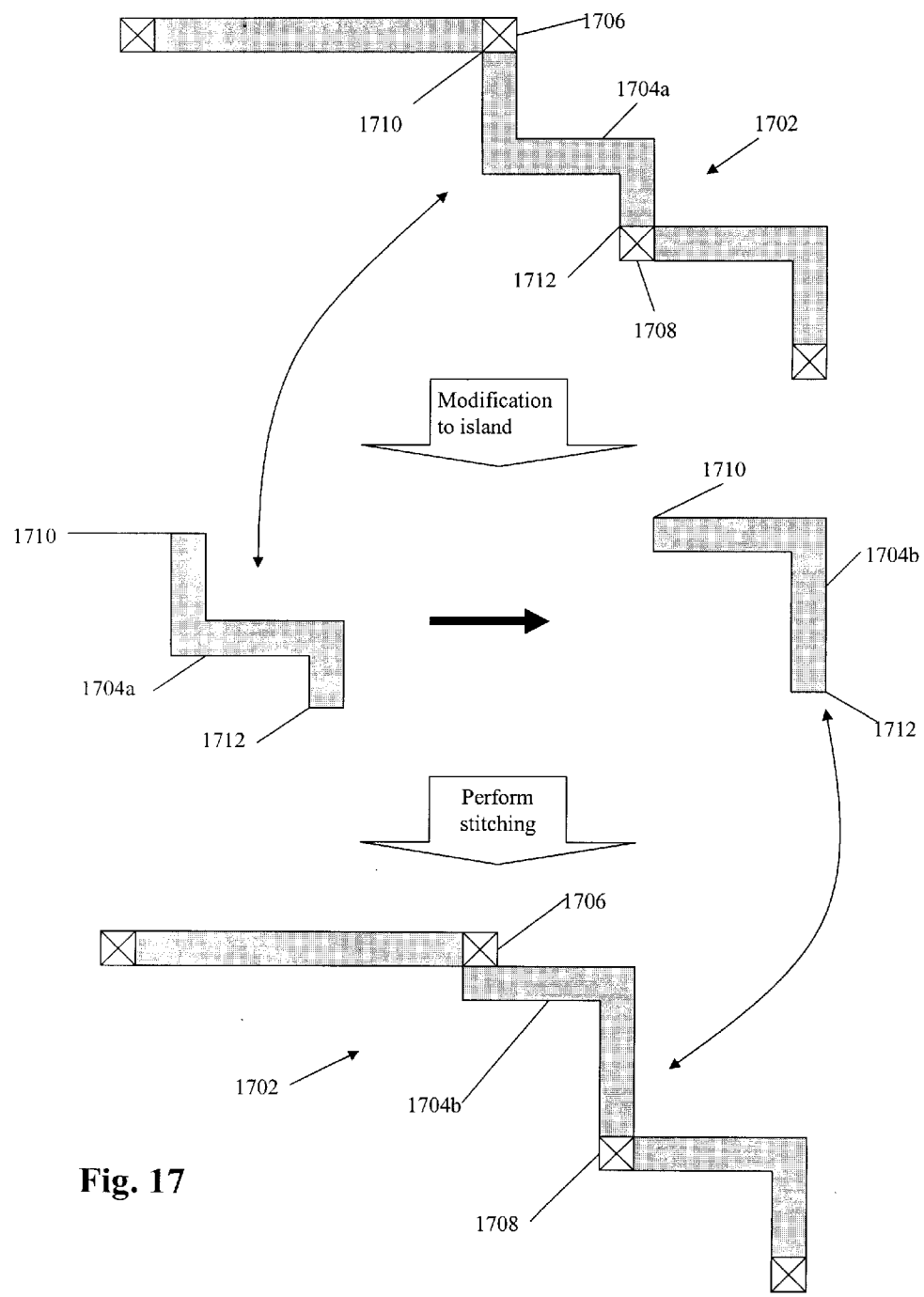
FIG. 17 provides an illustrative example of a process for stitching Islands together according to some embodiments of the invention.

FIG. 17 illustrates this process. At the top of this figure is a net 1702 that includes an Island 1704a. Island 1704a has vias 1706 and 1708 as its two natural endpoints Therefore, a first end 1710 of Island 1704a abuts via 1706 and a second end 1712 of Island 1704a abuts via 1708.

Consider if it is desired to modify this Island 1704a. In particular, consider if it is desired to modify Island 1704a to become 1704b as shown. To make this modification, the locations of ends 1710 and 1712 are tracked and maintained when making the modification from 1704a to 1704b. In addition, if there are any in cross-coupling nodes that need to be maintained, those nodes are also maintained.

Once the modifications have been made, the new Island 1704b is stitched back into net 1702. Since ends 1710 and 1712 are in the same locations, Island 1704b can be placed in exactly the correct position to line up against vias 1706 and 1708.

System Architecture Overview

Figure 18:
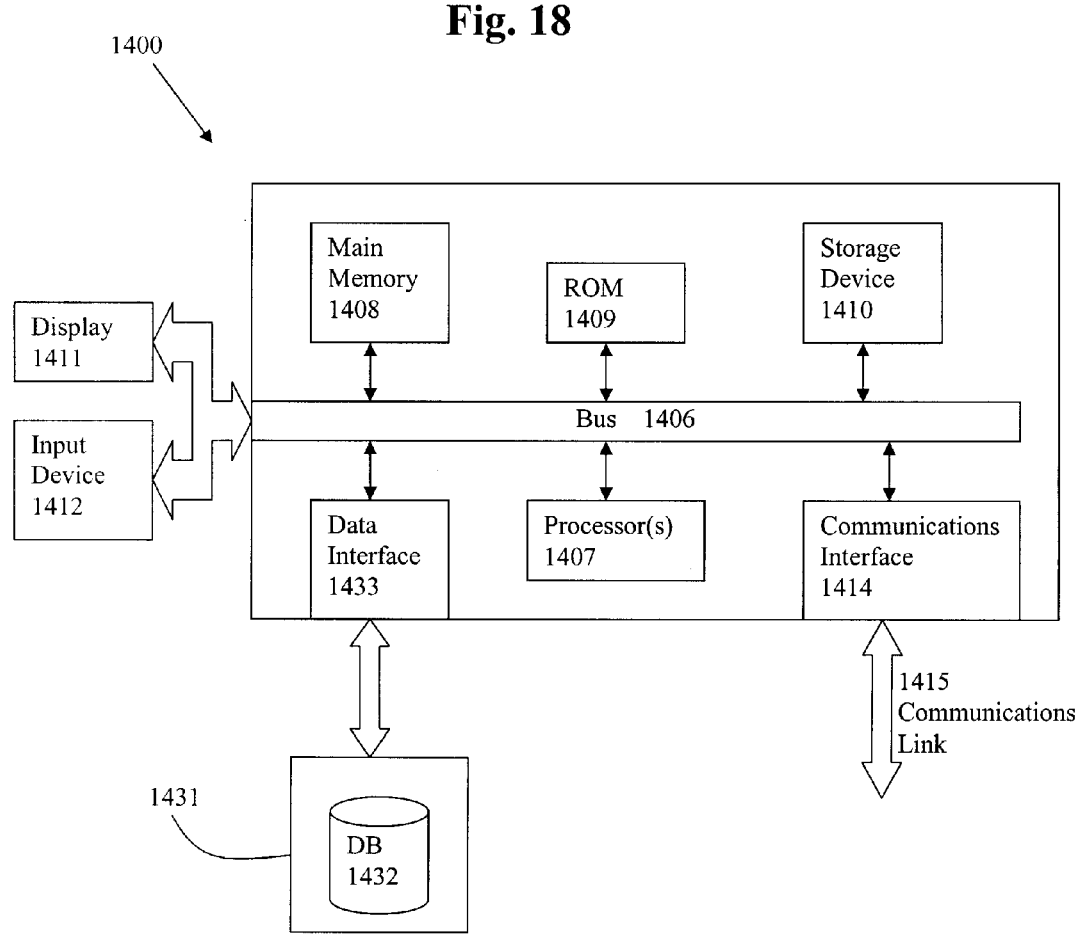
FIG. 18 illustrates an example computing architecture with which embodiments of the invention may be practiced.

FIG. 18 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method of performing incremental extraction on an integrated circuit design, the method comprising:
   using at least one processor that is programmed or configured for performing a process, the process comprising:
   performing extraction on an integrated circuit design;
   modifying the integrated circuit design;
   identifying an area of electrical influence for the integrated circuit design that is modified; and
   performing re-extraction for only a portion of a net corresponding to the area of electrical influence for the modification by at least identifying one or more characteristics of the integrated circuit design within a net tube, which comprises a shape that surrounds at least a part of the portion of the net and extends for a distance along the portion of the net, without performing re-extraction for the entire net.

2. The computer implemented method of claim 1, in which the portion of the net that is re-extracted corresponds to one or more islands, each of the one or more islands corresponding to a contiguous section of a net on a single layer of the integrated circuit design.

3. The computer implemented method of claim 1, in which the act of performing the re-extraction comprises:
   identifying the portion of the integrated circuit design to electrically analyze;
   identifying a halo;
   searching for one or more objects within the halo; and
   performing electrical analysis based upon the one or more objects.

4. The computer implemented method of claim 1, the process further comprising:
   identifying a first configuration and a second configuration in the integrated circuit design, in which
      the first configuration comprises a first number of shapes, and
      the second configuration comprises a second number of shapes; and
   performing a first operation on the first configuration or the second configuration.

5. The computer implemented method of claim 4, in which the first operation comprises removing an overlap among multiple shapes.

6. The computer implemented method of claim 4, in which the first operation comprises a normalization process.

7. The computer implemented method of claim 1, further comprising:
   identifying a plurality of segments or objects that are connected on a layer of the integrated circuit design;
   performing a second operation on the plurality of segments or objects; and
   creating an island by using at least some of the plurality of segments or objects based at least in part upon a result of the action of performing the second operation.

8. The computer implemented method of claim 7, in which the second operation comprises:
   removing an overlapping portion among the plurality of segments or objects; and
   normalizing at least some of the plurality of segments or objects.

9. The computer implemented method of claim 7, in which the second operation comprises a logical disjunction operation.

10. The computer implemented method of claim 1, in which the area of electrical influence comprises a multi-dimensional halo.

11. The computer implemented method of claim 1, in which portion of the net is identified by performing a search within the area of electrical influence.

12. The computer implemented method of claim 1, the process further comprising:
   determining whether a second net is cross coupled to at least the portion of the net; and
   maintaining cross reference between the at least the portion of the net and the second net.

13. The computer implemented method of claim 12, in which the action of maintaining the cross reference comprises:
   modifying at least the portion of the second net.

14. The computer implemented method of claim 13, in which the action of maintaining the cross reference comprises:
   providing a node to the second net at a location.

15. A system for performing extraction on an integrated circuit design, comprising:
   at least one processor that is at least to:
   perform extraction on an integrated circuit design;
   modify the integrated circuit design;
   identify area of electrical influence for the modification; and
   perform re-extraction for only a portion of a net corresponding to the area of electrical influence for the modification by at least identifying one or more characteristics of the integrated circuit design within a net tube, which comprises a shape that surrounds at least a part of the portion of the net and extends for a distance along the portion of the net, without performing re-extraction for the entire net.

16. The system of claim 15, in which the at least one processor that is to perform the re-extraction is further to:
   identify the portion of the integrated circuit design to electrically analyze;
   identify a halo;
   search for one or more objects within the halo; and
   perform an electrical analysis based at least in part upon the one or more objects.

17. The system of claim 15, in which the at least one processor is further to:
   identify a first configuration and a second configuration in the integrated circuit design, in which
      the first configuration comprises a first number of shapes, and
      the second configuration comprises a second number of shapes; and
   perform a first operation on the first configuration or the second configuration.

18. The system of claim 15, in which the at least one processor is further to:
   identify a plurality of segments or objects that are connected on a layer of the integrated circuit design;
   perform a second operation on the plurality of segments or objects; and
   create an island by using at least some of the plurality of segments or objects based at least in part upon a result of the action of performing the second operation.

19. The system of claim 15, in which the at least one processor is further to:
   determine whether a second net is cross coupled to at least the portion of the net; and
   maintain cross reference between the at least the portion of the net and the second net, in which the at least one processor that is to maintain the cross reference is further to:
   modify at least the portion of the second net; or
   provide a node to the second net at a location.

20. An article of manufacture comprising a non-transitory computer readable storage medium having stored thereupon a sequence of instructions which, when executed by at least one processor, cause the at least one processor to execute a method for performing extraction on an integrated circuit design, the method comprising:
   using at least one processor that is configured or programmed for performing a process, the process comprising:
   performing extraction on an integrated circuit design;
   modifying the integrated circuit design;
   identifying area of electrical influence for the modification; and
   performing re-extraction for only a portion of a net corresponding to the area of electrical influence for the modification by at least identifying one or more characteristics of the integrated circuit design within a net tube, which comprises a shape that surrounds at least a part of the portion of the net and extends for a distance along the portion of the net, without performing re-extraction for the entire net.

21. The article of manufacture of claim 20, in which the at least one processor programmed or configured for performing the re-extraction is further programmed or configured for performing the process, the process further comprising:
   identifying the portion of the integrated circuit design to electrically analyze;
   identifying a halo;
   searching for one or more objects within the halo; and
   performing electrical analysis based upon the one or more objects.

22. The article of manufacture of claim 20, the process further comprising:
   identifying a first configuration and a second configuration in the integrated circuit design, in which
      the first configuration comprises a first number of shapes, and the second configuration comprises a second number of shapes; and performing a first operation on the first configuration or the second configuration.

23. The article of manufacture of claim 20, the process further comprising:
identifying a plurality of segments or objects that are connected on a layer of the integrated circuit design;
performing a second operation on the plurality of segments or objects; and
creating an island by using at least some of the plurality of segments or objects based at least in part upon a result of the action of performing the second operation.

24. The article of manufacture of claim 20, the process further comprising:
determining whether a second net is cross coupled to at least the portion of the net; and
maintaining cross reference between the at least the portion of the net and the second net, in which the action of maintaining the cross reference comprises at least one of:
modifying at least the portion of the second net; and
providing a node to the second net at a location.

* * * * *